United States Patent [19]

Sobue et al.

[11] Patent Number: 5,394,038
[45] Date of Patent: Feb. 28, 1995

[54] OUTPUT CIRCUIT COMPRISING BIPOLAR TRANSISTORS FOR DRIVING CMOS CIRCUIT TO REDUCE POWER CONSUMPTION OF THE OUTPUT CIRCUIT AND AVOID ERRONEOUS OPERATION OF THE CMOS CIRCUIT

[75] Inventors: Mamoru Sobue; Katsuya Shimizu, both of Kasugai, Japan

[73] Assignees: Fujitsu Limited, Kawasaki; Fujitsu VLSI Limited, Kasugai, both of Japan

[21] Appl. No.: 259,155

[22] Filed: Jun. 13, 1994

Related U.S. Application Data

[63] Continuation of Ser. No. 93,655, Jul. 20, 1993, abandoned, which is a continuation of Ser. No. 850,825, Mar. 13, 1992, abandoned.

[30] Foreign Application Priority Data

Mar. 16, 1991 [JP] Japan ................... 3-051761

[51] Int. Cl.$^6$ ................ H03K 17/60; H03K 5/00; H03K 19/0175
[52] U.S. Cl. .................. 327/432; 327/109; 326/82
[58] Field of Search ........... 307/547, 549, 555, 262, 307/475, 570, 455, 456, 454

[56] References Cited

U.S. PATENT DOCUMENTS

| | | | |
|---|---|---|---|
| 3,553,486 | 1/1971 | Dow | 307/549 |
| 4,631,422 | 12/1986 | Piasecki | 307/456 |
| 4,682,050 | 7/1987 | Beranger et al. | 307/547 |
| 4,835,420 | 5/1989 | Rosky | 307/454 |

*Primary Examiner*—John S. Heyman
*Assistant Examiner*—Toan Tran
*Attorney, Agent, or Firm*—Staas & Halsey

[57] ABSTRACT

An output circuit, having a plurality of bipolar transistors for driving a CMOS circuit, comprises an output level maintaining transistor connected between an output terminal of the output circuit and ground. The output level maintaining transistor maintains a level of the output terminal at a specific high potential by transmitting a current from the output terminal to the ground when the output circuit is outputting a high level signal to the output terminal, and the output level maintaining transistor is cut OFF when the output circuit is outputting a low level signal to the output terminal. Consequently, the output circuit according to the present invention reduces power consumption of the output circuit and avoids erroneous operation of the CMOS circuit.

7 Claims, 4 Drawing Sheets

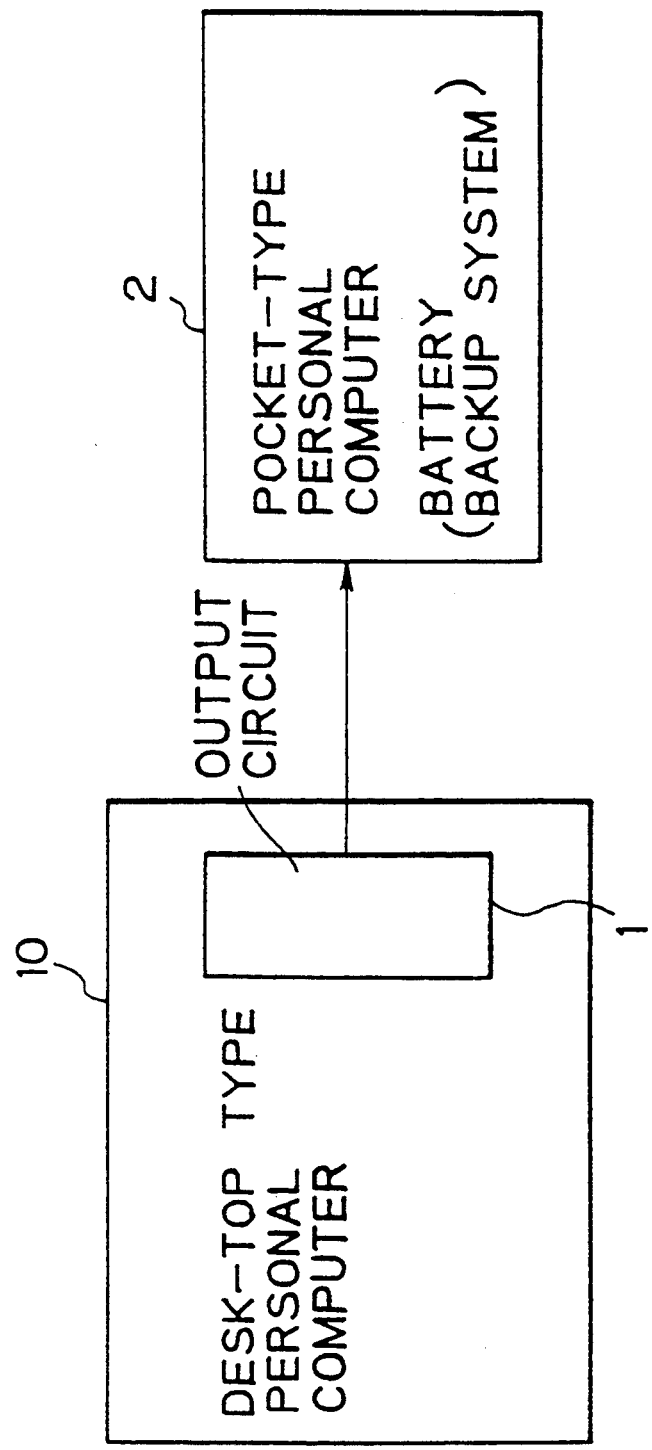

OUTPUT CIRCUIT COMPRISING BIPOLAR TRANSISTORS FOR DRIVING CMOS CIRCUIT TO REDUCE POWER CONSUMPTION OF THE OUTPUT CIRCUIT AND AVOID ERRONEOUS OPERATION OF THE CMOS CIRCUIT

This application is a continuation of application Ser. No. 08/093,655, filed Jul. 20, 1993, now abandoned, which is a continuation of application Ser. No. 07/850,825, filed Mar. 13, 1992, now abandoned.

BACKGROUND OF THE INVENTION

1. Field of the Invention

The present invention relates to an output circuit and, more particularly, to an output circuit comprising a plurality of bipolar transistors for driving a complementary metal-oxide-semiconductor (CMOS) circuit, or a complementary metal-insulation-semiconductor (CMIS) circuit.

2. Description of the Related Art

Conventionally, an output circuit comprising a plurality of bipolar transistors for driving a CMOS circuit has been constituted structured as a Darlington connection type output circuit, which can provide a large amount of driving power, thereby to realize a high speed operation for driving the CMOS circuit by reducing the influences of a stray capacitor existing on an input of the CMOS circuit.

Nevertheless, when a power supply voltage of the output circuit (bipolar transistor circuit) is higher than that of the CMOS circuit and the output circuit outputs a high level signal, the high level signal output from the output circuit may be determined to be potentially higher than the power supply voltage of the CMOS circuit, and thereby erroneous operations of the CMOS circuit may occur. The problems of the output circuit according to the related art will be explained in detail hereinafter.

SUMMARY OF THE INVENTION

An object of the present invention is to provide an output circuit comprising a plurality of bipolar transistors for driving a CMOS circuit in which the power consumption of the output circuit is reduced and erroneous operation of the CMOS circuit is avoided.

According to the present invention, there is provided an output circuit having a plurality of bipolar transistors for driving a CMIS circuit, wherein the output circuit comprises: a high-potential power supply line; a low-potential power supply line; an output level maintaining transistor connected between an output terminal of the output circuit and the second power supply line, the output level maintaining transistor maintaining a level of the output terminal at a specific high potential by transmitting a current from the output terminal to the low-potential power supply line when the output circuit is outputting a high level signal to the output terminal, and the output level maintaining transistor being cut OFF when the output circuit is outputting a low level signal to the output terminal.

The current flowing through the output level maintaining transistor may be controlled by a current control transistor, and the current control transistor and the output level maintaining transistor may constitute a Current-Mirror connection. The output level maintaining transistor and the current control transistor may be formed by NPN type bipolar transistors.

The current control transistor may be controlled by a switching control transistor connected in series between the high-potential power supply line and the low-potential power supply line through a constant current source. The current of the constant current source may flow through the switching control transistor and the current control transistor when the output circuit is outputting the high level signal to the output terminal, and the current of the constant current source may flow through another transistor when the output circuit is outputting the low level signal to the output terminal.

The output circuit may comprise a first Darlington connection constituted by a first pair of bipolar transistors connected to the high-potential power supply line for outputting the high level signal to the output terminal, and a second Darlington connection constituted by a second pair of bipolar transistors connected to the low-potential power supply line for outputting the low level signal to the output terminal.

BRIEF DESCRIPTION OF THE DRAWINGS

The present invention will be more clearly understood from the description of the preferred embodiments as set forth below with reference to the accompanying drawings, wherein:

FIG. 4 is a block diagram showing an example of a system constituted by two kinds of personal computers using the output circuit shown in FIG. 3.

DESCRIPTION OF THE PREFERRED EMBODIMENTS

For a better understanding of the preferred embodiments, the problems of the related art will be explained, with reference to FIGS. 1 and 2.

Figure 1:
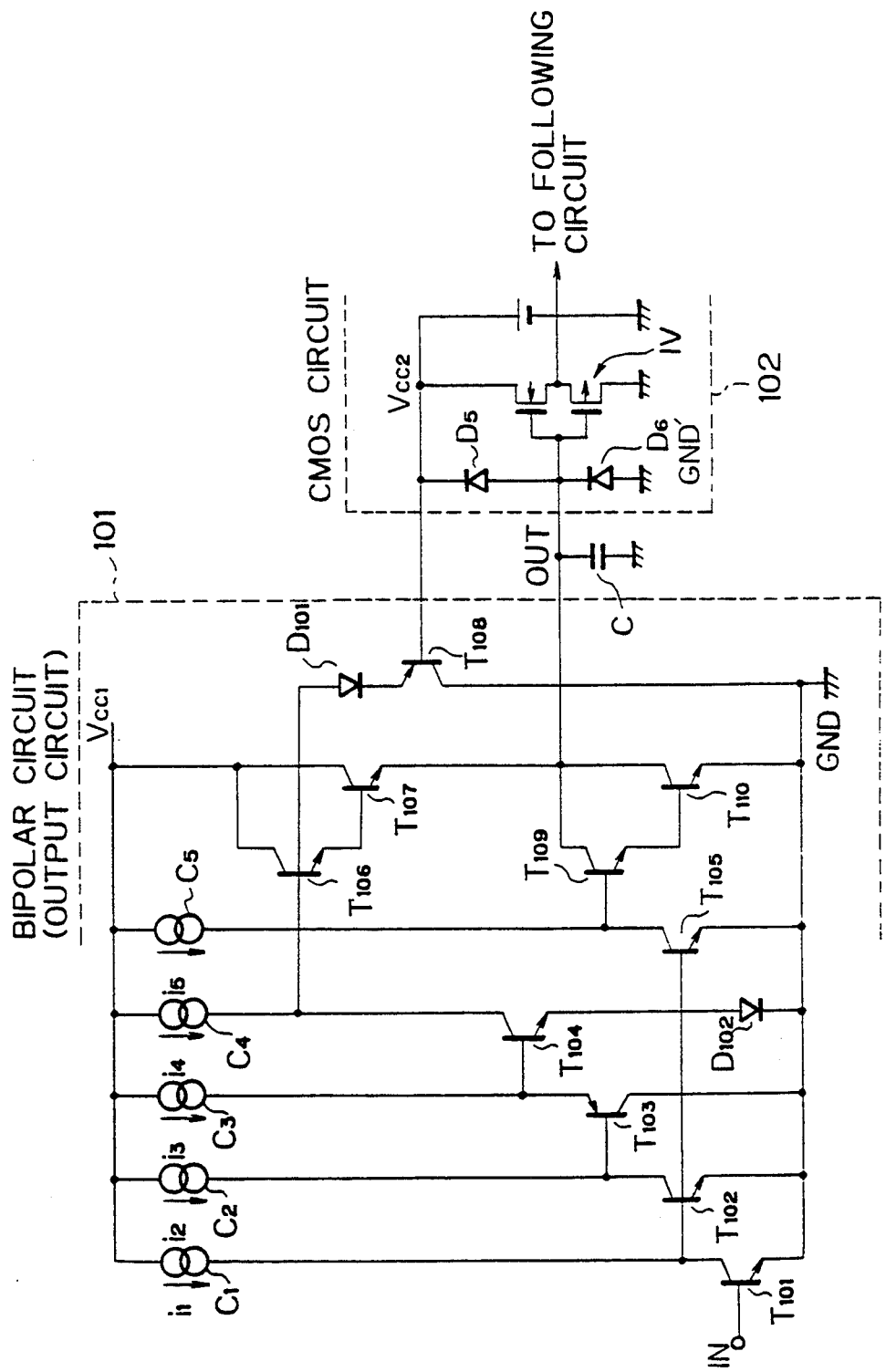
FIG. 1 is a circuit diagram showing an example of an output circuit according to the related art.

FIG. 1 is a circuit diagram showing an example of an output circuit according to the related art. In FIG. 1, reference numeral 101 denotes an output circuit, and 102 denotes a CMOS (CMIS) circuit. Further, reference $V_{cc1}$ denotes a high-potential power supply (for example, 5 volts) of the output circuit 101, $V_{cc2}$ denotes a high-potential power supply (for example, 0 volts) of the CMOS circuit 102, GND denotes the ground (for example, −3 volts) of the output circuit 101, and GND' denotes the ground (for example, −2.7 volts) of the CMOS circuit 102. Note, the output circuit 101 is utilized, for example, in a desk-top type computer which may use a battery backup system, and the CMOS circuit 102 is, for example, a pocket type personal computer using a battery backup system. Further, the high-potential power supply (5 volts) of the output circuit 101 may be higher than the high-potential power supply (0 volts) of the CMOS circuit 102, and the ground GND (−3 volts) of the output circuit 101 is different from the ground GND' (−2.7 volts) of the CMOS circuit 102.

As shown in FIG. 1, the output circuit 101 comprises a plurality of NPN-type bipolar transistors $T_{101}$, $T_{102}$, $T_{104}$, $T_{105}$, $T_{106}$, $T_{107}$, $T_{109}$, $T_{110}$, PNP-type bipolar transistors $T_{103}$, $T_{108}$, and diodes $D_{101}$, $D_{102}$. Note, in the output circuit 101, references $C_1$ to $C_5$ denote constant current sources.

The respective collector electrodes of the transistors $T_{101}$, $T_{102}$, $T_{104}$, $T_{105}$ are connected to the high-potential power supply $Vcc_1$ through the associated constant current sources $C_1$, $C_2$, $C_4$, $C_5$, and the emitter electrode of the transistor $T_{103}$ is connected to the high-potential power supply $Vcc_1$ through the constant current sources $C_3$. Further, the respective emitter electrodes of the transistors $T_{101}$, $T_{102}$, $T_{105}$ and the collector electrode of the transistor $T_{103}$ are connected to the ground GND, and the emitter electrode of the transistor $T_{104}$ is connected to the ground GND through the diode $D_{102}$. Note, a base electrode of the transistor $T_{101}$ is supplied with an input signal IN, and a base electrode of the transistor $T_{102}$ is connected to the collector electrode of the transistor $T_{101}$. Further, a base electrode of the transistor $T_{103}$ is connected to the collector electrode of the transistor $T_{102}$, and a base electrode of the transistor $T_{104}$ is connected to the emitter electrode of the transistor $T_{103}$.

In the output circuit of FIG. 1, the collector electrode of the transistor $T_{104}$ is also connected to a base electrode of the transistor $T_{106}$, and to an emitter electrode of the transistor $T_{103}$ through the diode $D_{101}$. Further, an emitter electrode of the transistor $T_{106}$ is connected to a base electrode of the transistor $T_{107}$, and collector electrodes of the transistors $T_{106}$ and $T_{107}$ are commonly connected to the high-potential power supply $Vcc_1$. Namely, the transistors $T_{106}$ and $T_{107}$ constitute a Darlington connection.

Further, in the output circuit of FIG. 1, the collector electrode of the transistor $T_{105}$ is also connected to a base electrode of the transistor $T_{109}$. An emitter electrode of the transistor $T_{109}$ is connected to a base electrode of the transistor $T_{110}$, and collector electrodes of the transistors $T_{109}$ and $T_{110}$ are commonly connected to an emitter electrode of the transistor $T_{107}$ and the output terminal OUT of the output circuit 101. Namely, the transistors $T_{109}$ and $T_{110}$ constitute a Darlington connection. Note, a collector electrode of the transistor $T_{108}$ is connected to the ground GND, and a base electrode of the transistor $T_{108}$ is supplied with the high-potential power supply $Vcc_2$ of the CMOS circuit 102.

As shown in FIG. 1, in the CMOS circuit 102, a diode $D_5$ is provided between the high-potential power supply $Vcc_2$ and an input terminal (i.e., the output terminal OUT of the output circuit 101) of the CMOS circuit 102, and a diode $D_6$ is provided between the input terminal and the ground GND' of the CMOS circuit 102, to avoid electrostatic destruction. Note, the input terminal of the CMOS circuit 102 is connected to a following circuit through a first inverter circuit IV. Further, a reference C denotes a stray capacitor existing on the input terminal of the CMOS circuit 102.

Note, in the above described output circuit shown in FIG. 1, Darlington connections constituted by the transistors $T_{106}$, $T_{107}$, and $T_{109}$, $T_{110}$, which can provide a large amount of driving power, are used to avoid a signal delay caused by the stray capacitor C in the CMOS circuit 102. Nevertheless, when the output signal (OUT) of the output circuit 101 (input signal of the CMOS circuit 102) is at a high level, that is, when the transistors $T_{106}$, $T_{107}$ are turned ON and the transistors $T_{109}$, $T_{110}$ are cut OFF, a current of the input terminal of the CMOS circuit 102 does not flow. Namely, when the output signal of the output circuit 101 is at a high level, the input of the CMOS circuit 102, connected to an input of the inverter IV, is at a high impedance. Therefore, after the stray capacitor C is sufficiently charged by the current flowing through the transistor $T_{107}$, the base-emitter voltage $V_{BE}$ of each of the transistors $T_{106}$ and $T_{107}$ becomes small, so that the potential of the input signal of the CMOS circuit 102 may be determined to be higher than the high-potential power supply $Vcc_2$ of the CMOS circuit 102, and further, an erroneous operation may occur in the CMOS circuit 102.

Figure 2:
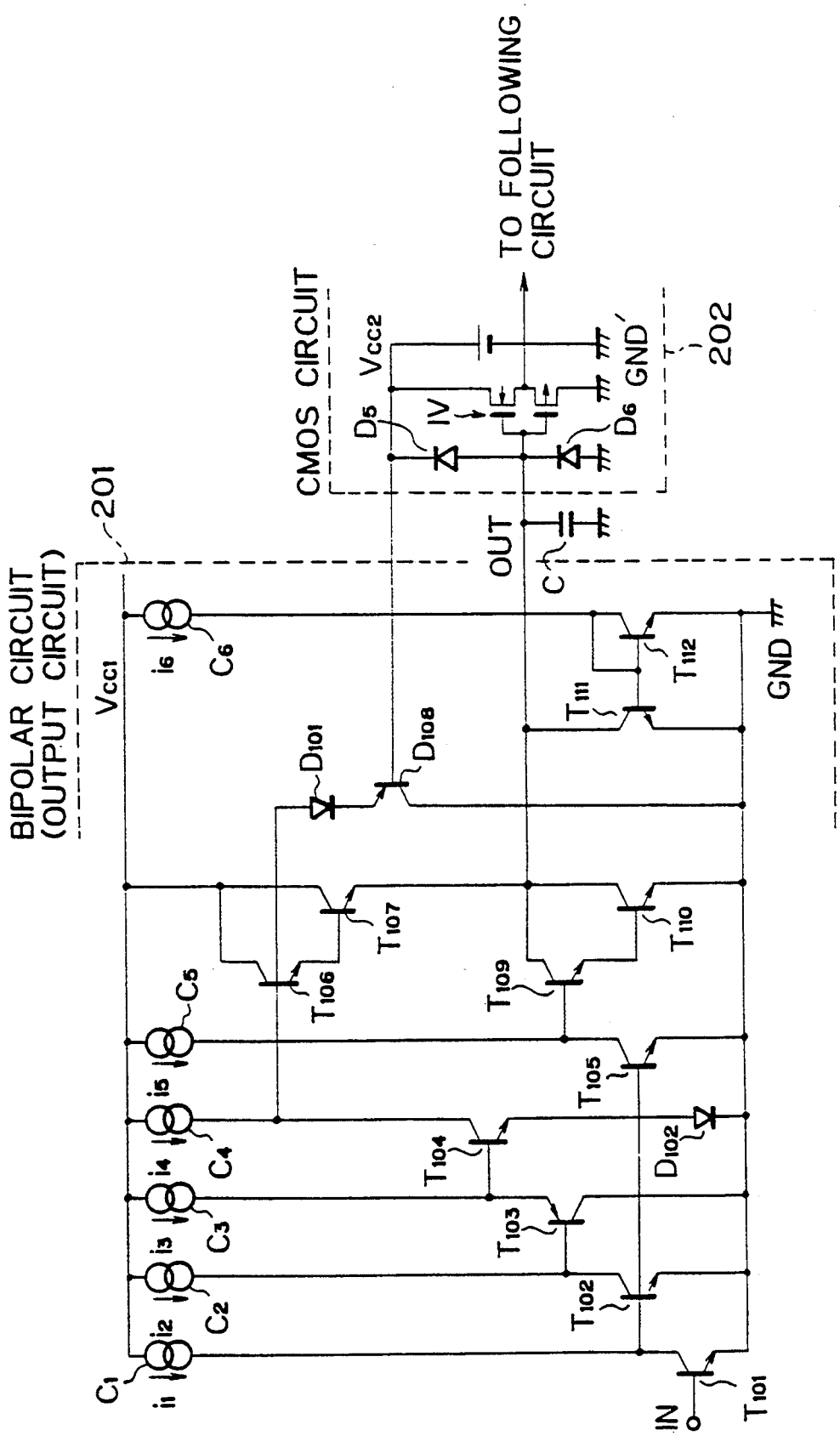
FIG. 2 is a circuit diagram showing another example of an output circuit according to the related art.

FIG. 2 is a circuit diagram showing another example of an output circuit according to the related art. Note, in the output circuit 201 of FIG. 2, two NPN-bipolar transistors $T_{111}$ and $T_{112}$ are added to the output circuit 101 shown in FIG. 1.

As shown in FIG. 2, a collector electrode of the transistor $T_{111}$ is connected to the output terminal OUT of the output circuit 201 (which is also the input terminal of a CMOS circuit 202), and an emitter electrode thereof is connected to the ground GND of the output circuit 201. Further, a collector electrode of the transistor $T_{112}$ is connected to the high-potential power supply $Vcc_1$ through a constant current source $C_6$, a base electrode of the transistor $T_{112}$ is commonly connected to both the collector electrode and the base electrode of the transistor $T_{111}$, and an emitter electrode of the transistor $T_{112}$ is connected to the ground GND. Note, these transistors $T_{111}$ and $T_{112}$ constitute a Current-Mirror connection, and a current flowing through the transistor $T_{111}$ is determined in accordance with a current $i_6$ flowing through the transistor $T_{112}$.

Therefore, when the level of the output terminal OUT of the output circuit 201 (input terminal of the CMOS circuit 202) is at a high level, the level of the output terminal OUT of the output circuit 201 is maintained at a specific high potential by the current which flows from the output terminal OUT to the ground GND through the transistor $T_{111}$, and which current (i.e. which flows through the transistor $T_{111}$) corresponds to the current $i_6$ flowing through the transistor $T_{112}$.

Nevertheless, in the output circuit shown in FIG. 2, when the level of the output terminal OUT of the output circuit 201 is changed to a low level, that is, when the output signal of the output circuit 101 is at a low level, the transistors $T_{111}$ and $T_{112}$ are maintained in turned-on states, and thus the current ($i_6$) is continuously flowing through the transistor $T_{112}$. Consequently, power consumption of the output circuit 201 becomes large, and thus this output circuit 201 cannot be applied to small electronic equipment using a battery backup system.

Below, the preferred embodiments of an output circuit according to the present invention will be explained with reference to the accompanying drawings.

Figure 3:
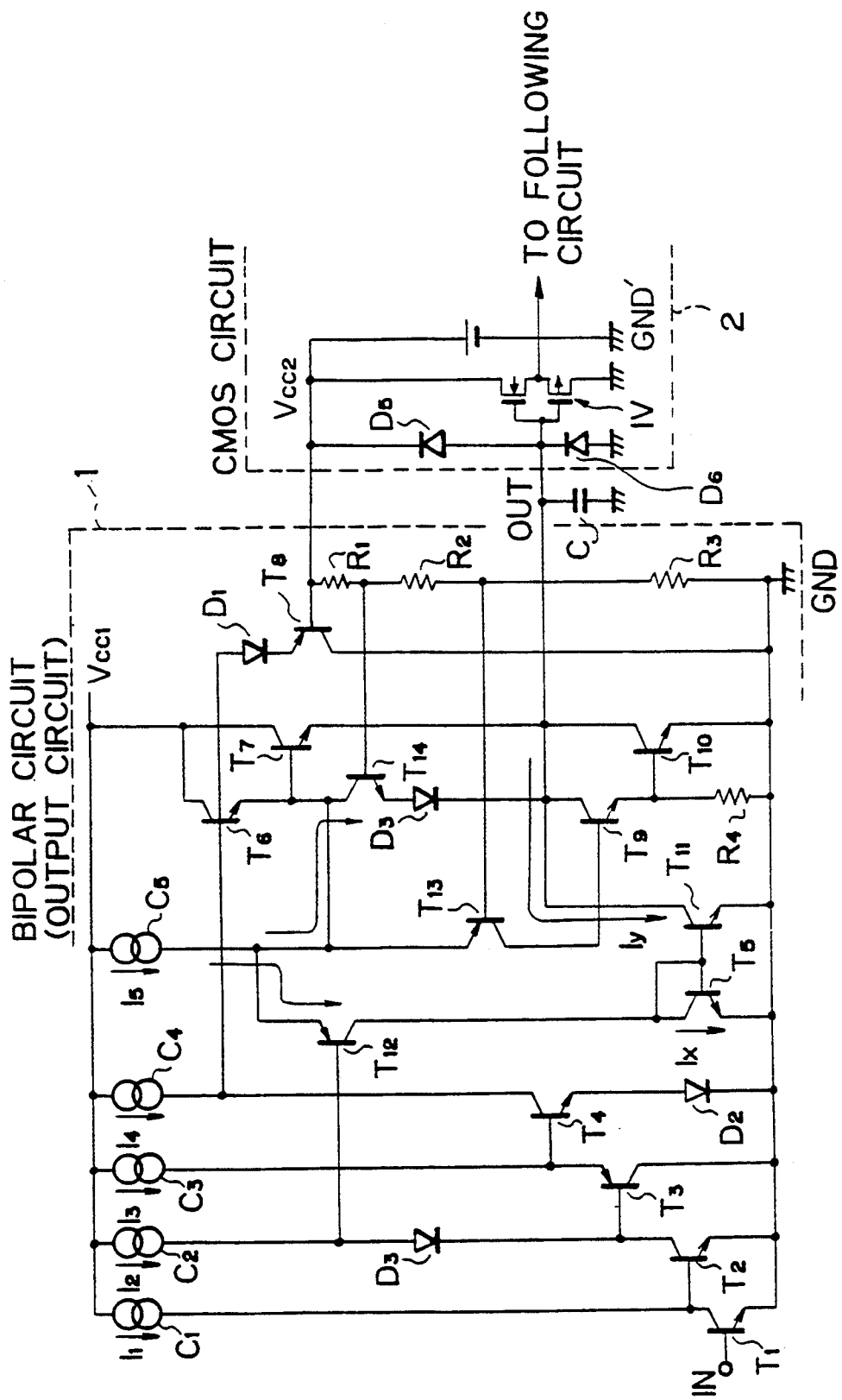
FIG. 3 is a circuit diagram showing an embodiment of an output circuit according to the present invention.

FIG. 3 is a circuit diagram showing an embodiment of an output circuit according to the present invention. In FIG. 3, reference numeral 1 denotes an output circuit, and 2 denotes a CMOS (CMIS) circuit. Further, reference $Vcc_1$ denotes a high-potential power supply (for example, 5 volts) of the output circuit 1, $Vcc_2$ denotes a high-potential power supply (for example, 0 volts) of the CMOS circuit 2, GND denotes the ground (for example, $-3$ volts) of the output circuit 1, and GND' denotes the ground (for example, $-2.7$ volts) of the CMOS circuit 2. Note, the output circuit 1 is utilized, for example, in a desk-top type or notebook type personal computer which may use a battery backup system, and the CMOS circuit 2 is, for example, a pocket type or wristwatch type personal computer using a battery backup system. Further, the high-potential power supply (5 volts) of the CMOS circuit 1 may be higher than the high-potential power supply (0 volts) of the CMOS circuit 2, and the ground GND ($-3$ volts) of the output circuit 1 is different from the ground GND' ($-2.7$ volts) of the CMOS circuit 2.

As shown in FIG. 3, the output circuit 1 comprises a plurality of NPN-type bipolar transistors $T_1$, $T_2$, $T_4$, $T_5$, $T_6$, $T_7$, $T_9$, $T_{10}$, $T_{11}$, $T_{14}$, PNP-type bipolar transistors $T_3$, $T_8$, $T_{12}$, $T_{13}$, diodes $D_1$, $D_2$, $D_3$ and resistors $R_1$, $R_2$, $R_3$. Note, in the output circuit 1, references $C_1$ to $C_5$ denote constant current sources.

The collector electrode of the transistor $T_1$ is connected to the high-potential power supply $Vcc_1$ through the constant current source $C_1$, a collector electrode of the transistor $T_8$ is connected to a base electrode of the transistor $T_3$ and to the high-potential power supply $Vcc_1$ through the diode $D_3$ and the constant current source $C_2$, and a connection node of the diode $D_8$ and the constant current source $C_2$ is connected to a base electrode of the transistor (switching control transistor) $T_{12}$. Further, an emitter electrode of the transistor $T_8$ is connected to a base electrode of the transistor $T_4$ and to the high-potential power supply $Vcc_1$ through the constant current source $C_3$, and a collector electrode of the transistor $T_4$ is connected to the high-potential power supply $Vcc_1$. In addition, an emitter electrode of the transistor $T_{12}$ is connected to a collector electrode of the transistor $T_{14}$ and an emitter of the transistor $T_8$, and to the high-potential power supply $Vcc_1$ through the constant current source $C_5$. Note, a base electrode of the transistor $T_1$ is supplied with an input signal IN, and emitter electrodes of the transistors $T_1$, $T_2$ and a collector electrode of the transistor $T_8$ are connected to the ground (low-potential power supply line) GND, and an emitter electrode of the transistor $T_4$ is connected to the ground GND through the diode $D_2$. Further, the diode $D_3$ is used to prevent saturation of the transistor $T_{12}$.

As shown in FIG. 3, the collector electrode of the transistor $T_4$ is also connected to a base electrode of the transistor $T_6$ and to an emitter electrode of the transistor $T_8$ through the diode $D_1$. Further, the emitter electrode of the transistor $T_{12}$ is also connected to an emitter electrode of the transistor $T_6$ and a base electrode of the transistor $T_7$, and collector electrodes of the transistors $T_6$ and $T_7$ are commonly connected to the high-potential power supply $Vcc_1$. Namely, the transistors $T_6$ and $T_7$ constitute a Darlington connection. Further, a collector electrode of the transistor $T_{12}$ is connected to both the base and collector electrodes of the transistor (current control transistor) $T_5$ and to a base electrode of the transistor (output level maintaining transistor) $T_{11}$, and each of the respective emitter electrodes of the transistors $T_5$ and $T_{11}$ is connected to the ground GND. Namely, the transistors $T_5$ and $T_{11}$ constitute a Current-Mirror connection, and a current Iy flowing through the transistor $T_{11}$ is determined in accordance with a current Ix flowing through the transistor $T_5$. Note, the PNP-type bipolar transistor $T_{12}$ is used to control the current Ix flowing through the transistor $T_5$, that is, the transistor $T_{12}$ is used to control the current Iy flowing from the output terminal OUT to the ground GND through the transistor $T_{11}$. Further, when the transistor $T_{12}$ is turned ON, the NPN-type bipolar transistor $T_{14}$ is cut OFF, and further when the transistor $T_{12}$ is cut OFF, the transistor $T_{14}$ is turned ON. Therefore, one constant current source $C_5$ can be used to transmit a current ($I_5$) through the transistor $T_{12}$ or $T_{14}$.

A collector electrode of the transistor $T_{11}$ is connected to the respective collector electrodes of the transistors $T_9$ and $T_{10}$ and to the output terminal OUT of the output circuit 1, and to an emitter electrode of the transistor $T_{14}$ through the diode $D_3$. Further, an emitter electrode of the transistor $T_9$ is connected to a base electrode of the transistor $T_{10}$ and to the ground GND through the resistor $R_4$, and an emitter electrode of the transistor $T_{10}$ is connected to the ground GND. Namely, the transistors $T_9$ and $T_{10}$ constitute a Darlington connection. As shown in FIG. 3, a collector electrode of the transistor $T_{13}$ is connected to a base electrode of the transistor $T_9$, and a base electrode of the transistor $T_{13}$ is connected to the ground GND through the resistor $R_8$ and to a base electrode of the transistor $T_8$ through the resistors $R_1$ and $R_2$. Note, the resistors $R_1$, $R_2$ and $R_3$ are used to determine reference voltages applied to the bases of the transistors $T_{14}$ and $T_{13}$.

In this output circuit of FIG. 3, a base electrode of the transistor $T_8$ is supplied with the high-potential power supply $Vcc_2$ of the CMOS circuit 2, and a collector electrode of the transistor $T_8$ is connected to the ground GND of the output circuit 1. Further, a base electrode of the transistor $T_{14}$ is connected to a connection node of the resistors $R_1$ and $R_2$.

As shown in FIG. 3, in the CMOS circuit 2, a diode $D_5$ is provided between the high-potential power supply $Vcc_2$ and an input terminal (i.e., the output terminal OUT of the output circuit 1) of the CMOS circuit 2, and a diode $D_6$ is provided between the input terminal and the ground GND' of the CMOS circuit 2, to avoid electrostatic destruction. Note, the input terminal of the CMOS circuit 2 is connected to a following circuit through a first inverter circuit IV. Further, a reference C denotes a stray capacitor existing on the input terminal of the CMOS circuit 2.

Note, in the above described output circuit shown in FIG. 3, Darlington connections constituted by the transistors $T_6$, $T_7$ and $T_9$, $T_{10}$, which provide a large amount of driving power, are used to avoid a signal delay caused by the stray capacitor C in the CMOS circuit 2. Furthermore, in the output circuit of the present embodiment, only when the output signal (OUT) of the output circuit 1 (input signal of the CMOS circuit 2) is at a high level, the current Iy flows from the output terminal OUT of the output circuit 1 through the transistor $T_{11}$. Note, the current Iy flowing through the transistor $T_{11}$ corresponds to the current Ix through the transistor $T_5$, and the output signal (OUT) of the output circuit 1 can be maintained at a specific high potential (for example, $-2.0$ volts). Consequently, by comparing the output circuit shown in FIG. 3 with that shown in FIG. 2, the output circuit 1 of FIG. 3 can reduce power consumption of the output circuit 1 and avoid erroneous operation of the CMOS circuit 2.

Next, operations of the output circuit of FIG. 3 will be explained.

First, when a level of an input terminal IN of the output circuit 1 is low, which corresponds to when a level of the output terminal OUT of the output circuit 1 is high, the transistors $T_1$, $T_4$, $T_9$, $T_{10}$, $T_{13}$, $T_{14}$ are cut OFF, and the transistors $T_2$, $T_3$, $T_5$, $T_6$, $T_7$, $T_8$, $T_{11}$, $T_{12}$ are turned ON. Namely, the transistors $T_6$ and $T_7$ constituting a Darlington connection are turned ON and the transistors $T_9$ and $T_{10}$ constituting a Darlington connection are cut OFF, and thus the output terminal OUT is brought to a high level. Note, in this case, the high level signal of the output terminal OUT is supplied to the CMOS circuit 2, thereby the stray capacitor C of the CMOS circuit 2 is charged. Further, after the stray capacitor C is sufficiently charged by the high level signal of the output terminal OUT, the current Iy flows from the output terminal OUT (input signal of the CMOS circuit 2) to the ground GND through the transistor (output level maintaining transistor) $T_{11}$, so that the potential of the input signal of the CMOS circuit 2 is maintained at a specific high level.

Namely, when an input signal (IN) of the output circuit 1 is at a low level, or when the output circuit 1 is outputting a high level signal to the CMOS circuit 2, the PNP-type bipolar transistor (switching control transistor) $T_{12}$ is turned ON, the PNP-type bipolar transistor $T_{13}$ is cut OFF, and the NPN-type bipolar transistor (current control transistor) $T_5$ is turned ON, so that a current Ix ($I_5$) flows through the transistors $T_{12}$ and $T_5$. Therefore, the NPN-type bipolar transistor $T_{11}$, which constitutes a Current-Mirror connection with the transistor $T_5$, is also turned ON, and a current Iy corresponding to the current Ix flows. In this case, the NPN-type bipolar transistors $T_9$ and $T_{10}$ are cut OFF, and thus the current Iy of a specific value flows from the output terminal OUT to the ground GND through the transistor $T_{11}$. Consequently, the respective base-emitter voltages $V_{BE}$ of the transistor $T_6$ and $T_7$ ($T_{106}$ and $T_{107}$) do not become small after the stray capacitor C is sufficiently charged; further, the potential of the input signal of the CMOS circuit 2 (102) does not become higher than the high-potential power supply $Vcc_2$ of the CMOS circuit 2, and thus an erroneous operation does not occur in the CMOS circuit 2, as described above with reference to FIG. 1.

Note, a potential of the output signal appearing at the output terminal OUT is maintained (or fixed) at a specific high level determined by the high-potential power supply $Vcc_2$ of the CMOS circuit 2, the transistors $T_6$, $T_7$, $T_8$, and the diode $D_1$. Namely, the specific high potential (the potential of the output terminal OUT) is determined by subtracting the characteristic voltages (saturation voltage and forward voltage) of the transistor $T_8$ and the diode $D_1$ from, and adding the characteristic voltages of the transistors $T_6$ and $T_7$ to, the high-potential power supply $Vcc_2$ (reference voltage) of the CMOS circuit 2. Consequently the potential of the output terminal OUT does not exceed the high-potential power supply $Vcc_2$ of the CMOS circuit 2, and erroneous operations do not occur.

Conversely, when an input signal (IN) of the output circuit 1 is at a high level, or when the output circuit outputs a low level signal to the CMOS circuit 2, the transistors $T_1$, $T_4$, $T_9$, $T_{10}$, $T_{13}$, $T_{14}$ are turned ON, and the transistors $T_2$, $T_3$, $T_5$, $T_6$, $T_7$, $T_8$, $T_{11}$, $T_{12}$ are cut OFF. Namely, the transistors $T_6$ and $T_7$ constituting a Darlington connection are cut OFF and the transistors $T_9$ and $T_{10}$ constituting a Darlington connection are turned ON, and thus the output terminal OUT (input signal of the CMOS circuit 2) becomes low. Note, in this case, the PNP-type bipolar transistor $T_{12}$, and the NPN-type bipolar transistors $T_5$ and $T_{11}$ constituting a Current-Mirror connection are altogether cut OFF, so that unnecessary currents do not flow. Consequently, according to the output circuit of the present embodiment, power consumption can be reduced. Further, the current $I_5$ flows to the ground GND through the transistor $T_{14}$, the diode $D_3$, the transistor $T_9$, and the resistor $R_4$.

In the above described embodiment of the output circuit, shown in FIG. 3, when the output circuit 1 is outputting a low level signal to the CMOS circuit 2, the transistor $T_{12}$ is turned ON and the transistor $T_{14}$ is cut OFF, and the current $I_5$ flows through the transistor $T_{12}$. Conversely, when the output circuit 1 is outputting a high level signal to the CMOS circuit 2, the transistor $T_{12}$ is cut OFF and the transistor $T_{14}$ is turned ON, and the current $I_5$ flows through the transistor $T_{14}$. Therefore, the constant current source $C_5$ can be used to transmit the current ($I_5$) through the transistor $T_{12}$ or $T_{14}$. Namely, one constant current source can be omitted by applying one constant current source $C_5$ to two transistors $T_{12}$ and $T_{14}$. Further, the series connection nodes between resistors $R_1$ and $R_2$ between $R_2$ and $R_3$ are used to determine respective reference voltages applied to the bases of the transistors $T_{14}$ and $T_{13}$.

FIG. 4 is a block diagram showing an example of a system constituted by two kinds of personal computers using the output circuit shown in FIG. 3. In FIG. 4, a reference numeral 10 denotes a desk-top type personal computer (or notebook type personal computer) which may use a battery backup system, and the output circuit 1 is utilized therein for outputting data or various signals to the pocket-type personal computer (CMOS circuit) 2. In this example, the CMOS circuit 2 is specified as a pocket type personal computer using a battery backup system. Note, as explained with reference to FIG. 3, the power supply voltages ($Vcc_1$, $Vcc_2$) of the desk-top type personal computer 10 and the pocket type personal computer 2 may be different, and further the ground voltages thereof may also be different. Nevertheless, by applying the output circuit 1 of the present embodiment to the desk-top type personal computer 10, erroneous operation of the pocket type personal computer 2 can be avoided and power consumption of the desk-top type personal computer 10 can be reduced. In addition, the CMOS circuit 2 is not limited to the pocket type personal computer 2, but the CMOS circuit 2 may be a wristwatch-type computer, and the like.

As described above, the output circuit according to the present invention can reduce power consumption and avoid erroneous operation of a CMOS circuit receiving an output signal from the output circuit.

Many different embodiments of the present invention may be constructed without departing from the spirit and scope of the present invention, and it should be understood that the present invention is not limited to the specific embodiments described in this specification, except as defined in the appended claims.

We claim:

1. An output circuit having a plurality of bipolar transistors for driving a CMIS circuit, wherein said output circuit comprises;

a high-potential power supply line;

a low-potential power supply line;

an output terminal for outputting a signal to said CMIS circuit;

output transistors connected in series, at a series connection node common to said output terminal, between said high-potential power supply line and said low-potential power supply line; and an output level maintaining transistor connected between said output terminal of said output circuit and said low-potential power supply line, said output level maintaining transistor maintaining a level of said output terminal at a specific high potential by transmitting a current from said output terminal to said low-potential power supply line while said output circuit is outputting a high-level signal to said output terminal, and said output level maintaining transistor being cut OFF while said output circuit is outputting a low level signal to said output terminal.

2. An output circuit as claimed in claim 1, wherein the current flowing through said output level maintaining transistor is controlled by a current control transistor, said current control transistor and said output level maintaining transistor being connected in a Current-Mirror connection.

3. An output circuit as claimed in claim 2, wherein said output level maintaining transistor and said current control transistor comprise NPN type bipolar transistors.

4. An output circuit having a plurality of bipolar transistors for driving a CMIS circuit, wherein said output circuit comprises:
 a high-potential power supply line;
 a low-potential power supply line;
 an output terminal for outputting a signal to said CMIS circuit;
 output transistors connected in series, at a series connection node common to said output terminal, between said high-potential power supply line and said low-potential power supply line;
 an output level maintaining transistor connected between said output terminal of said output circuit and said low-potential power supply line, said output level maintaining transistor maintaining a level of said output terminal at a specific high potential by transmitting a current from said output terminal to said low-potential power supply line while said output circuit is outputting a high level signal to said output terminal, said output level maintaining transistor being cur OFF while said output circuit is outputting a low level signal to said output terminal;
 a current control transistor connected to said output level maintaining transistor in a Current-Mirror connection and controlling the current flowing through said output level maintaining transistor; and
 a switching control transistor which is connected in series between said high-potential power supply line and said low-potential power supply line through a constant current source and which controls the current control transistor.

5. An output circuit as claimed in claim 4, wherein the current of said constant current source flows through said switching control transistor and said current control transistor when said output circuit is outputting a high level signal to said output terminal, and the current of said constant current source flows through another transistor when said output circuit is outputting the low level signal to said output terminal.

6. An output circuit having a plurality of bipolar transistors for driving a CMIS circuit, wherein said output circuit comprises:
 a high-potential power supply line;
 a low-potential power supply line;
 an output terminal for outputting a signal to said CMIS circuit;
 output transistors connected in series, at a series connection node common to said output terminal, between said high-potential power supply line and said low-potential power supply line, said output transistors comprising a first Darlington connection of a first pair of bipolar transistors connected to said high-potential power supply line for outputting the high level signal to said output terminal, and a second Darlington connection of a second pair of bipolar transistors connected to said low-potential power supply line for outputting the low level signal to said output terminal; and
 an output level maintaining transistor connected between said output terminal of said output circuit and said low-potential power supply line, said output level maintaining transistor maintaining a level of said output terminal at a specific high potential by transmitting a current from said output terminal to said low-potential power supply line while said output circuit is outputting a high level signal to said output terminal, and said output level maintaining transistor being cut OFF while said output circuit is outputting a low level signal to said output terminal.

7. An output circuit having a plurality of bipolar transistors for driving a CMIS circuit, a high-potential power supply of said output circuit being of a higher potential than that of a high-potential power supply of said CMIS circuit, said output circuit comprising:
 a high-potential power supply line;
 a low-potential power supply line;
 an output terminal for outputting a signal to said CMIS circuit;
 output transistors connected in series, at a series connection node common to said output terminal, between said high-potential power supply line and said low-potential power supply line; and
 an output level maintaining transistor connected between said output terminal of said output circuit and said low-potential power supply line, said output level maintaining transistor maintaining said output terminal at a specific high potential by transmitting a current from said output terminal to said low-potential power supply line while said output circuit is outputting a high level signal to said output terminal, and said output level maintaining transistor being cut OFF while said output circuit is outputting a low level signal to said output terminal.

* * * * *

UNITED STATES PATENT AND TRADEMARK OFFICE
CERTIFICATE OF CORRECTION

PATENT NO. : 5,394,038
DATED : Feb. 28, 1995
INVENTOR(S) : SOBUE et al.

It is certified that error appears in the above-indentified patent and that said Letters Patent is hereby corrected as shown below:

Col. 1, line 24, delete "constituted".

Col. 2, line 36, change "circuit-shown" to --circuit shown--.

Col. 3, line 23, change "$T_{103}$" to --$T_{108}$--.

Col. 4, line 45, change "turned-on" to --turned-ON--.

Col. 5, line 2, change "CMOS" to --output--;
line 19, change "$D_8$" to --$D_3$--;
line 22, change "$T_8$" to --$T_3$--;
line 29, change "$T_8$" to --$T_{13}$--;
line 34, change "$T_8$" to --$T_3$--.

Col. 6, line 15, change "$R_8$" to --$R_3$--;
line 31, delete ",".

Col. 9, line 37 (Claim 4, line 21), change "cur" to --cut--.

Signed and Sealed this

Twelfth Day of September, 1995

Attest:

BRUCE LEHMAN

*Attesting Officer*         *Commissioner of Patents and Trademarks*